United States Patent [19]

Seidel et al.

[11] Patent Number: 5,442,218

[45] Date of Patent: Aug. 15, 1995

[54] CMOS POWER FET DRIVER INCLUDING MULTIPLE POWER MOSFET TRANSISTORS CONNECTED IN PARALLEL, EACH CARRYING AN EQUIVALENT PORTION OF THE TOTAL DRIVER CURRENT

[75] Inventors: Durbin L. Seidel; Donald M. Bartlett; Ricky F. Bitting; James F. Patella, all of Fort Collins, Colo.

[73] Assignees: AT&T Global Information Solutions Company, Dayton, Ohio; Hyundai Electronics America, Milpitas, Calif.

[21] Appl. No.: 128,428

[22] Filed: Sep. 30, 1993

[51] Int. Cl.[6] .................. H01L 29/772; H03K 17/695
[52] U.S. Cl. ..................................... 257/369; 257/786; 257/207; 327/437; 327/410
[58] Field of Search ............... 257/203, 207, 666, 691, 257/786, 368, 369; 307/446, 443, 412; 327/110, 437, 408, 409, 410

[56] References Cited

U.S. PATENT DOCUMENTS 5,060,048 10/1991 Hebenstreit et al. .............. 257/208

FOREIGN PATENT DOCUMENTS 0064941 4/1982 Japan ..................................... 257/203
0049463 2/1990 Japan ..................................... 257/207

*Primary Examiner*—William Mintel
*Assistant Examiner*—Peter Toby Brown
*Attorney, Agent, or Firm*—James M. Stover

[57] ABSTRACT

A CMOS motor drive for a disk drive spindle motor. The design of the drive circuit permits the integration of power electronics together with logic or other circuitry on a single integrated circuit wafer. For each motor phase the power electronics formed on the integrated circuit wafer includes a plurality of P-type and N-type MOSFET power transistor pairs and a plurality of corresponding output bonding pads; the drain terminals of each transistor pair being connected together to its corresponding output bonding pad. The wafer is enclosed in packaging which includes an output pin for providing an electrical connection to one phase of the disk drive spindle motor, and a plurality of bond wires corresponding to the plurality of output bonding pads, each bond wire providing an electrical connection between its corresponding bonding pad and the output pin. The transistor pairs and bond wires operate in parallel, each carrying an equivalent portion of the total current output presented at the output pin. The gate terminals of all the P-type MOSFET transistors are electrically connected together to a first control input; and the gate terminals of all the N-type MOSFET transistors are electrically connected together to a second control input. The source terminals of each of the P-type transistors are connected through corresponding bonding pads and bond wires to a first voltage source input pin. Similarly, the source terminals of each of the N-type transistors are connected through corresponding bonding pads and bond wires to a second voltage source input pin.

11 Claims, 5 Drawing Sheets

CMOS POWER FET DRIVER INCLUDING MULTIPLE POWER MOSFET TRANSISTORS CONNECTED IN PARALLEL, EACH CARRYING AN EQUIVALENT PORTION OF THE TOTAL DRIVER CURRENT

The present invention relates to power MOSFET drivers and, more particularly, to the integration of power MOSFET drivers into integrated circuits including other CMOS analog and logic circuitry.

BACKGROUND OF THE INVENTION

Metal oxide semiconductor field effect transistors (MOSFET) can be constructed to conduct large currents, on the order of several amperes. These high current MOSFETs may be employed within computer disk drives, power supplies, telecommunication devices, consumer electronics and many other devices. Within computer disk drives, high current MOSFETs may be employed as power switches in the drive electronics for the spindle motors, as shown in FIG. 1.

A schematic diagram of one phase of the drive electronics for a three-phase disk drive spindle motor 100 is shown in FIG. 1. Spindle motor 100, simplified for illustration, includes three stator coils, 102, 104 and 106. During operation of motor 100 the stator coils are selectively energized to cause the motor shaft or rotor (not shown) to turn at a desired rotational speed. Energizing a stator coil causes it to behave as a magnet with its strength and polarity determined by the amount and direction of current flow in the coil.

Energization of the stator coil 102 is controlled by commutation logic 110 and power transistors $M_1$ and $M_2$. Transistor $M_1$ is combined with an amplifier $A_1$ and sense resistor $R_1$ to form a negative feedback loop that controls the current supplied to stator coil 102. Commutation and control circuitry 110 controls the switching of power transistor $M_2$ and provides an input, identified as $V_{IN}$, to amplifier $A_1$ to control the operation of transistor $M_1$. The voltage signal $V_1$ determines the current in the power transistor $M_1$ and $M_2$ which in turn forces motor 100 to turn at a desired speed.

The construction and operation of the commutation logic, drive electronics and spindle motor as shown in FIG. 1 and discussed above are well known by those skilled in the art.

In past disk drive designs the power transistors that are used to drive the spindle motor have been discrete devices not integrated with any other circuitry. The fabrication of high current or high voltage power electronics on the same chip as with logic or other circuitry has required unique process considerations or chip architectures. In recent years, however, as the form factor sizes and power requirements of disk drives have decreased, some integration of power transistors with other circuitry has been accomplished in typical power semiconductor technologies such as bipolar and DMOS. Such integration is limited though, as many restrictions remain which constrain the integration of power circuitry together with other circuitry. The operating parameters and output requirements of the power electronics restrict such integration to specific applications.

The reduction of disk drive form factor size and power requirements has reduced the current requirement for a typical disk drive spindle motor to approximately 900 mA. It is probable that this value will be further reduced in the future as disk drive form factors and power requirements continue to shrink. However, the metalization and bond wire utilized in CMOS technology is not of adequate thickness to support current levels near 900 mA.

OBJECTS OF THE INVENTION

It is therefore an object of the present invention to provide a new and useful power FET design permitting integration of power electronics together with other analog and logic circuitry within a single integrated circuit.

It is another object of the present invention to provide a new and useful motor drive including power, logic and other electronic circuitry integrated together in a single integrated circuit.

It is yet another object of the present invention to provide such a motor drive for a disk drive spindle motor.

It is still a further object of the present invention to provide such a motor drive implemented in CMOS technology and capable of providing 900 mA of current per motor phase.

SUMMARY OF THE INVENTION

There is provided, in accordance with the present invention, a power electronic circuit design permitting the integration of power electronics together with logic or other circuitry on a single integrated circuit wafer. The power electronics formed on the integrated circuit wafer includes a plurality of power switch devices, such as MOSFET power transistors, and a plurality of corresponding output bonding pads; each power switch device having an output terminal connected to its corresponding output bonding pad. The wafer is enclosed in packaging which includes an output pin for providing an electrical connection to an external device, and a plurality of bond wires corresponding to the plurality of output bonding pads, each bond wire providing an electrical connection between its corresponding bonding pad and the output pin. The power devices and bond wires operate in parallel, each carrying an equivalent portion of the total current output presented at the output pin.

In the described embodiment, the power and other circuitry are implemented in CMOS technology. Each power switch device comprises a P-type MOSFET transistor and an N-type MOSFET transistor. The drain terminals of the two transistors are connected together to form the output terminal of the power switch device. The gate terminals of all the P-type MOSFET transistors are electrically connected together to a first control input; and the gate terminals of all the N-type MOSFET transistors are electrically connected together to a second control input. The source terminals of each of the P-type transistors are connected through corresponding bonding pads and bond wires to a first source voltage input pin. Similarly, the source terminals of each of the N-type transistors are connected through corresponding bonding pads and bond wires to a second source voltage input pin.

The power circuitry described briefly above forms the motor drive circuit for one phase of a three-phase spindle motor for a disk drive. The described circuitry is duplicated for each phase of the motor.

The above and other objects, features, and advantages of the present invention will become apparent from the following detailed specification when read in conjunction with the accompanying drawings in which applicable reference numerals have been carried forward.

BRIEF DESCRIPTION OF THE DRAWINGS

The following is a brief description of the drawing figures referred to in the specification of this letters patent.

DETAILED DESCRIPTION OF THE PREFERRED EMBODIMENT

The discussion which follows describes a CMOS motor drive structure for a disk drive spindle motor wherein the drive power electronics may be integrated together with analog, logic or other circuitry on a single integrated circuit. The layout and design of the power electronics circuitry supports the current flow necessary to drive a typical disk drive spindle motor.

Figure 2:
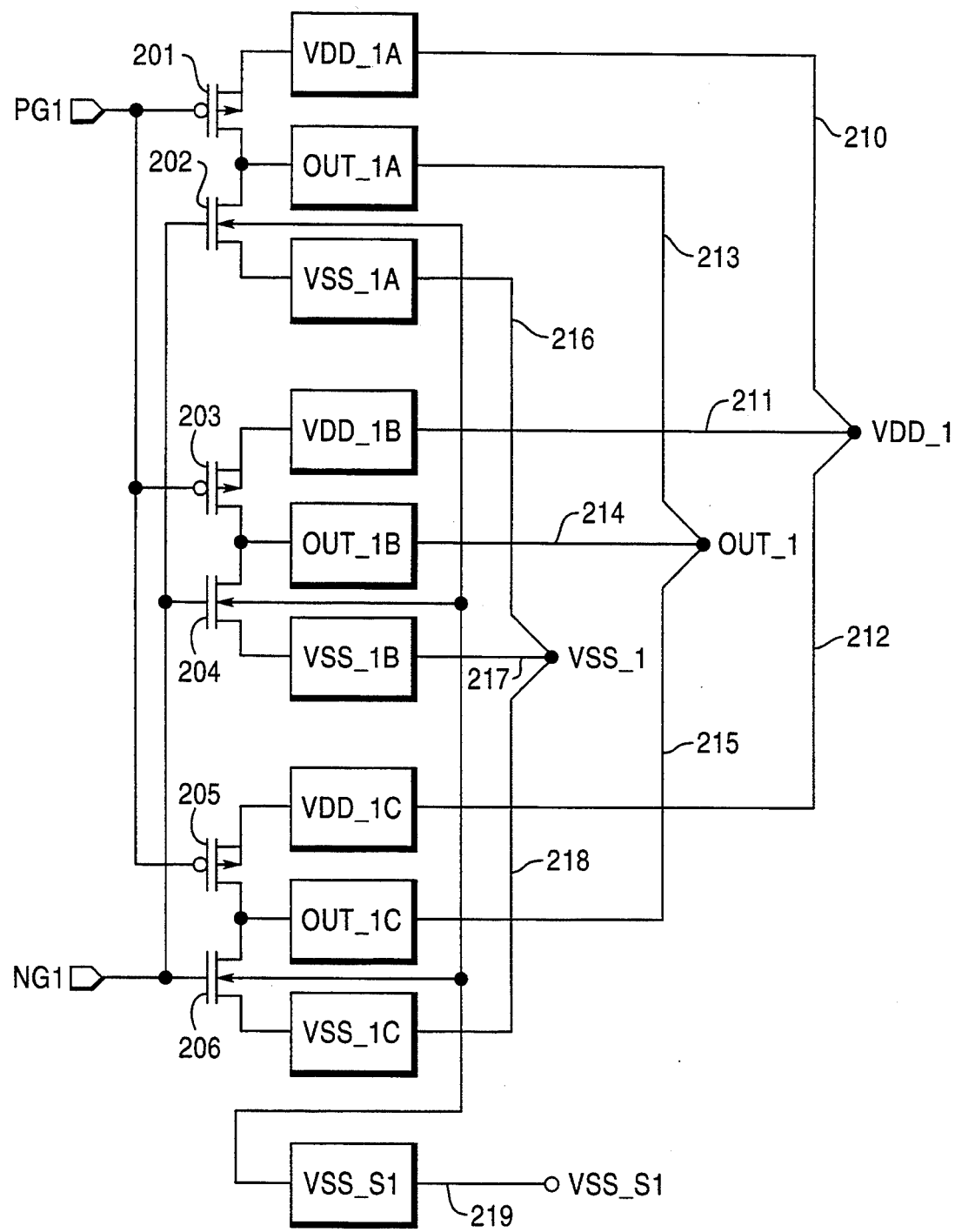
FIG. 2 is a schematic circuit diagram of the MOSFET power transistor electronics included within one phase of the motor drive electronics for a three-phase disk drive spindle motor constructed in accordance with the present invention.

The schematic circuit diagram of FIG. 2 shows the MOSFET power transistor electronics included within one phase of the motor drive electronics for a three-phase disk drive spindle motor. Three pairs of power transistors are shown, each including a P type and N type transistor. The transistor pairs are identified by reference numerals 201 and 202, 203 and 204, and 205 and 206. The transistors are connected so that each P and N pair share their drain connections. For example, the drain terminals of transistors 201 and 202 are connected together.

The gate terminals of each of P type transistors 201, 203 and 205 are connected to form a single input PG1. Similarly, the gate terminals of each one of N type transistors 202, 204 and 206 are connected to form a single input NG1. However, three VDD voltage source pads, three VSS voltage pads and three output pads, are shown. A single VDD pad, VSS pad and output pad are associated with each one of the three transistor pairs. The three VDD bonding pads, identified by reference numerals VDD_1A, VDD_1B and VDD_1C, are connected to the source terminals of transistors 201, 203 and 205, respectively. Similarly, the three VSS bonding pads, identified by reference numerals VSS_1A, VSS_1B and VSS_1C, are connected to the source terminals of transistors 202, 204 and 206, respectively. The three output pads, OUT_1A, OUT_1B and OUT_1C are connected to the common drain connections of the three transistor pairs 201-202, 203-204 and 205-206, respectively.

The integrated chip is packaged such that the three VDD voltage source bonding pads are connected through corresponding bond wires 210, 211 and 212 to a single package pin labeled VDD_1. Likewise, output bonding pads OUT_1A, OUT_1B and OUT_1C are connected through bond wires 213, 214 and 215, respectively, to a single package pin labeled OUT_1; and voltage source bonding pads VSS_1A, VSS_1B and VSS_1C are connected through bond wires 216, 217 and 218, respectively, to a single package pin labeled VSS_1.

The layout of the power electronics and signal paths on the integrated circuit chip must be arranged so that voltage source bonding pads VDD_1A, VDD_1B and VDD_1C are adjacent to one another, output bonding pads OUT_1A, OUT_1B and OUT_1C are located together, and voltage source bonding pads VSS_1A, VSS_1B and VSS_1C are adjacent one another on the integrated circuit. This positioning of the VDD, VSS and output bonding pads relative to one another is required because the bond wires can not cross over one another to establish connections between the bonding pads and package pins.

Figure 1:
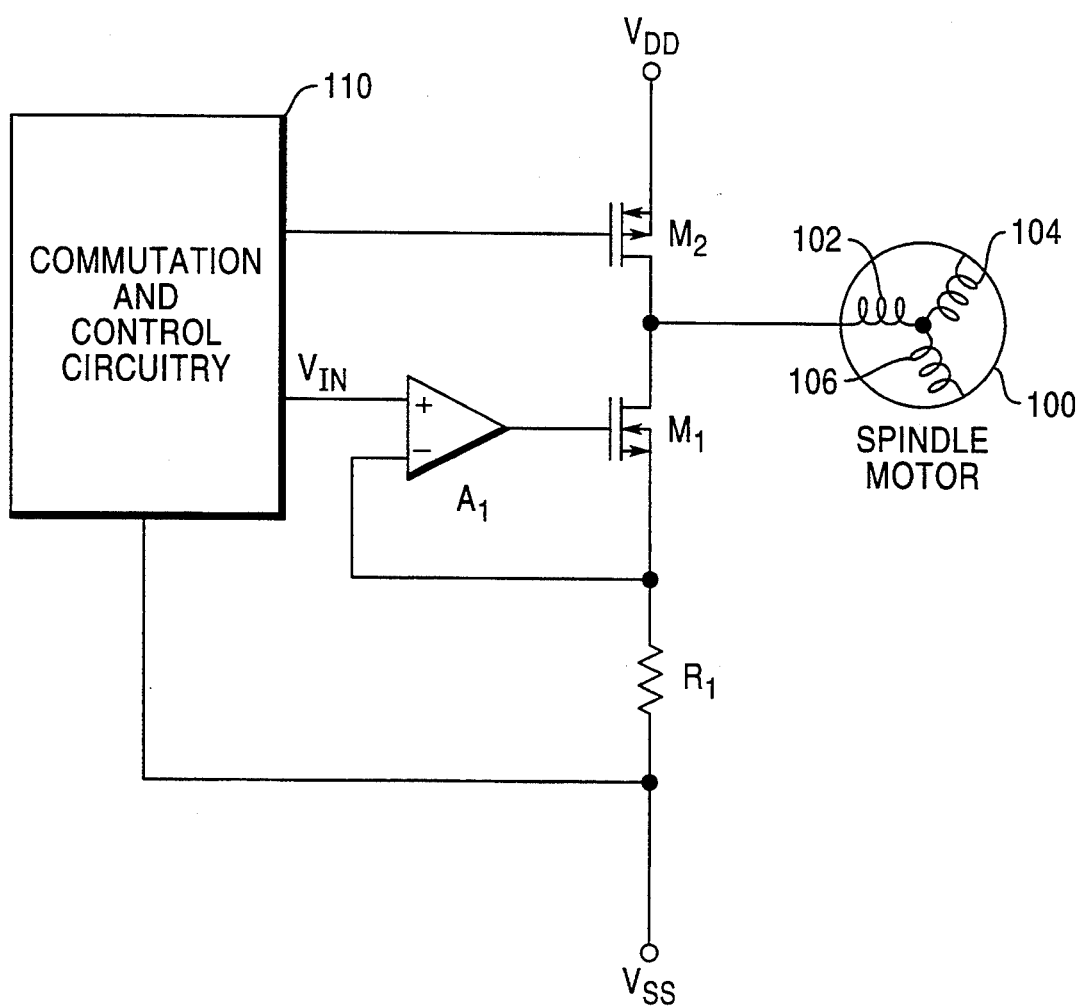
FIG. 1 is a simplified schematic circuit diagram of one phase of the drive electronics for a disk drive spindle motor.

In operation, the three pairs of transistors, 201-202, 203-204 and 205-206, function in parallel in response to control signals received at inputs PG1 and NG1. Each transistor pair operates in a conventional manner as described in the Background of the Invention with reference to FIG. 1. However, the current flow provided by each transistor pair will be one third of the phase current provided to the spindle motor. Thus, if each motor phase of the spindle motor draws 900 mA, the current provided by each transistor pair will be nominally 300 mA, an amount of current which can be supported by the CMOS structures and bond wires.

The schematic diagram of FIG. 2 shows the electronics included within one phase of the motor drive electronics for a three-phase disk drive spindle motor. The electronics structure and operation for the remaining two phases, shown in FIGS. 3 and 4, are identical to that shown in FIG. 2 and discussed above.

Figure 3:
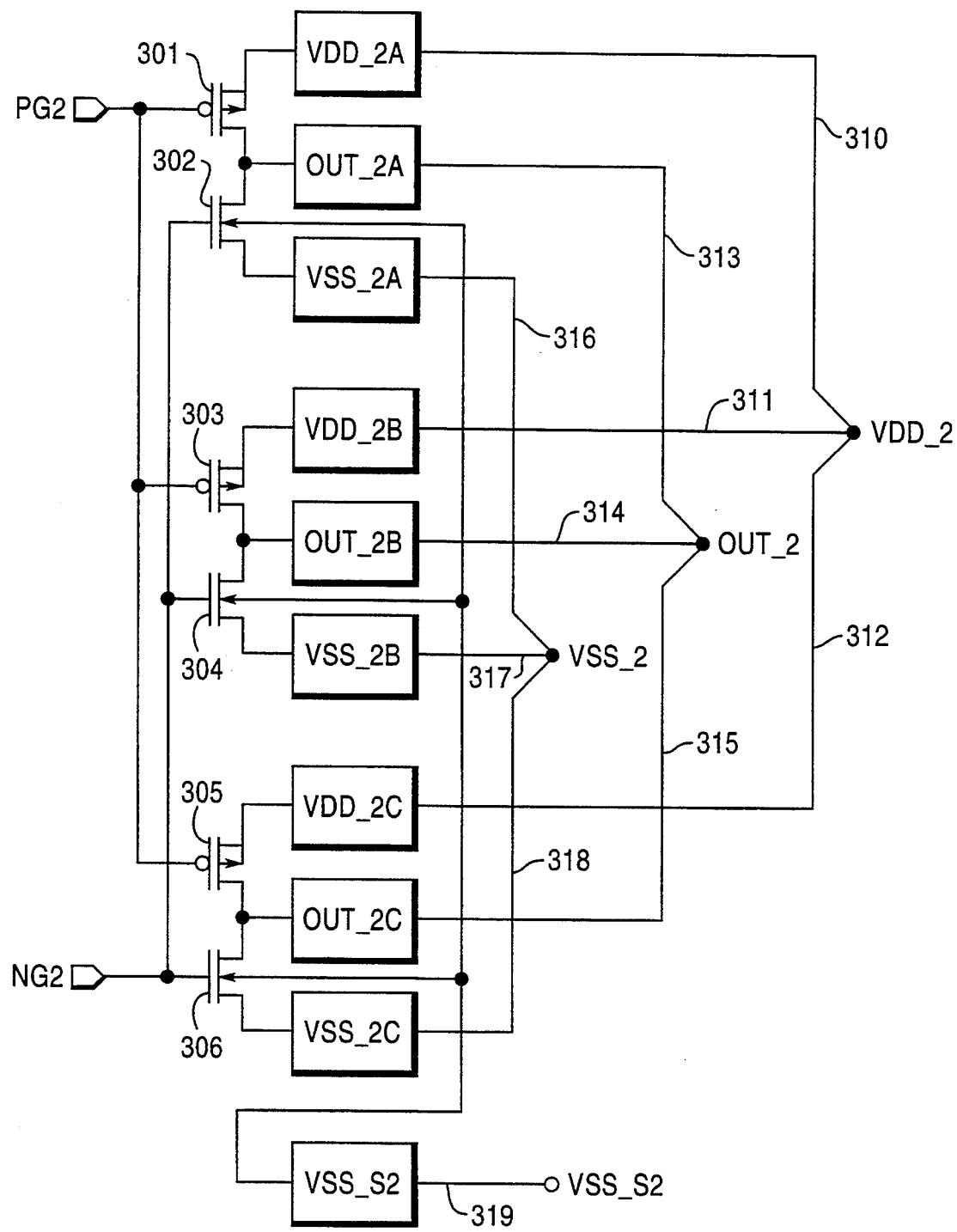
FIGS. 3 and 4 are schematic circuit diagrams of the MOSFET power transistor electronics included within the second and third phases of the motor drive electronics for a three-phase disk drive spindle motor the first phase of which is shown in FIG. 2.
Figure 4:
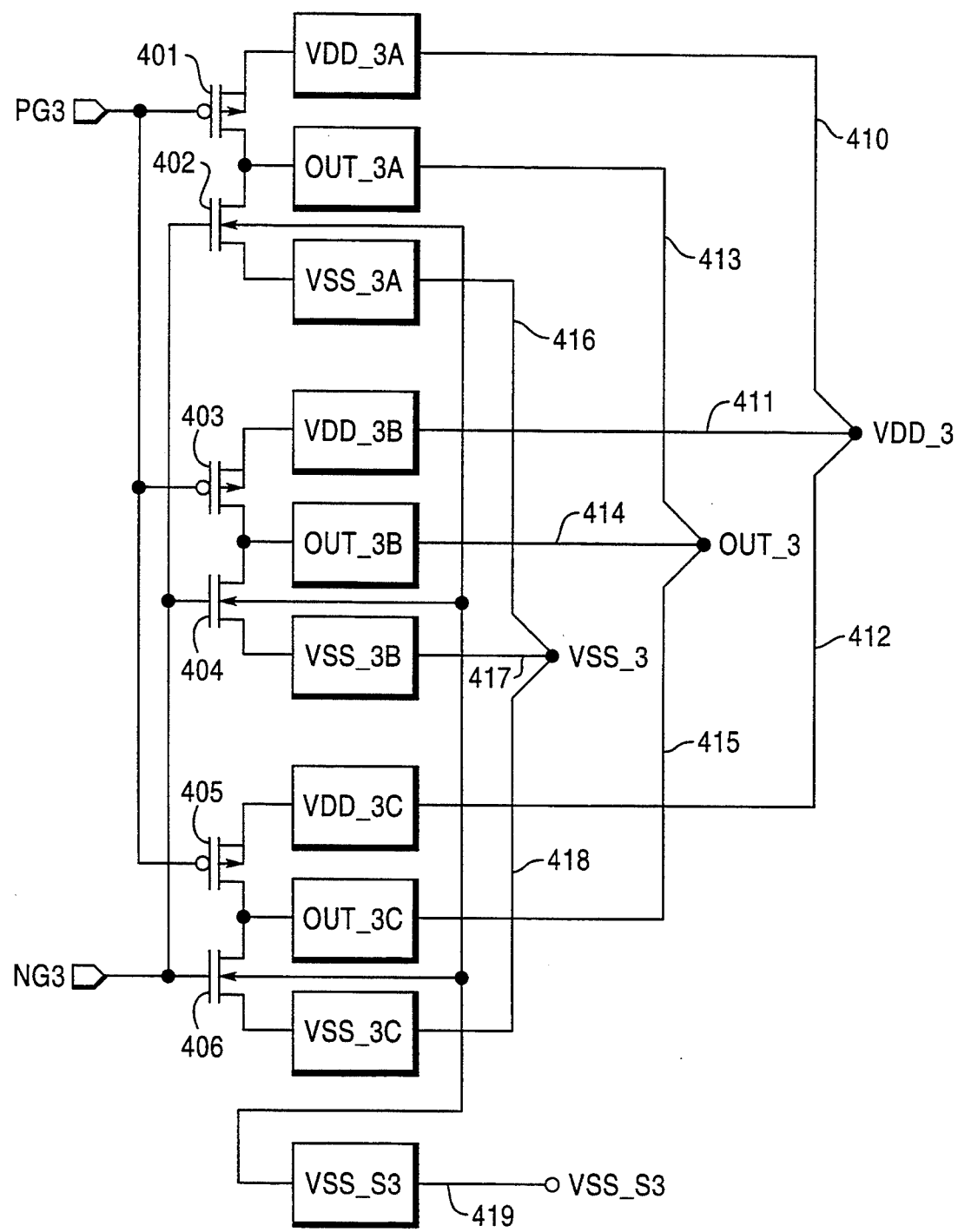
Figure 5:
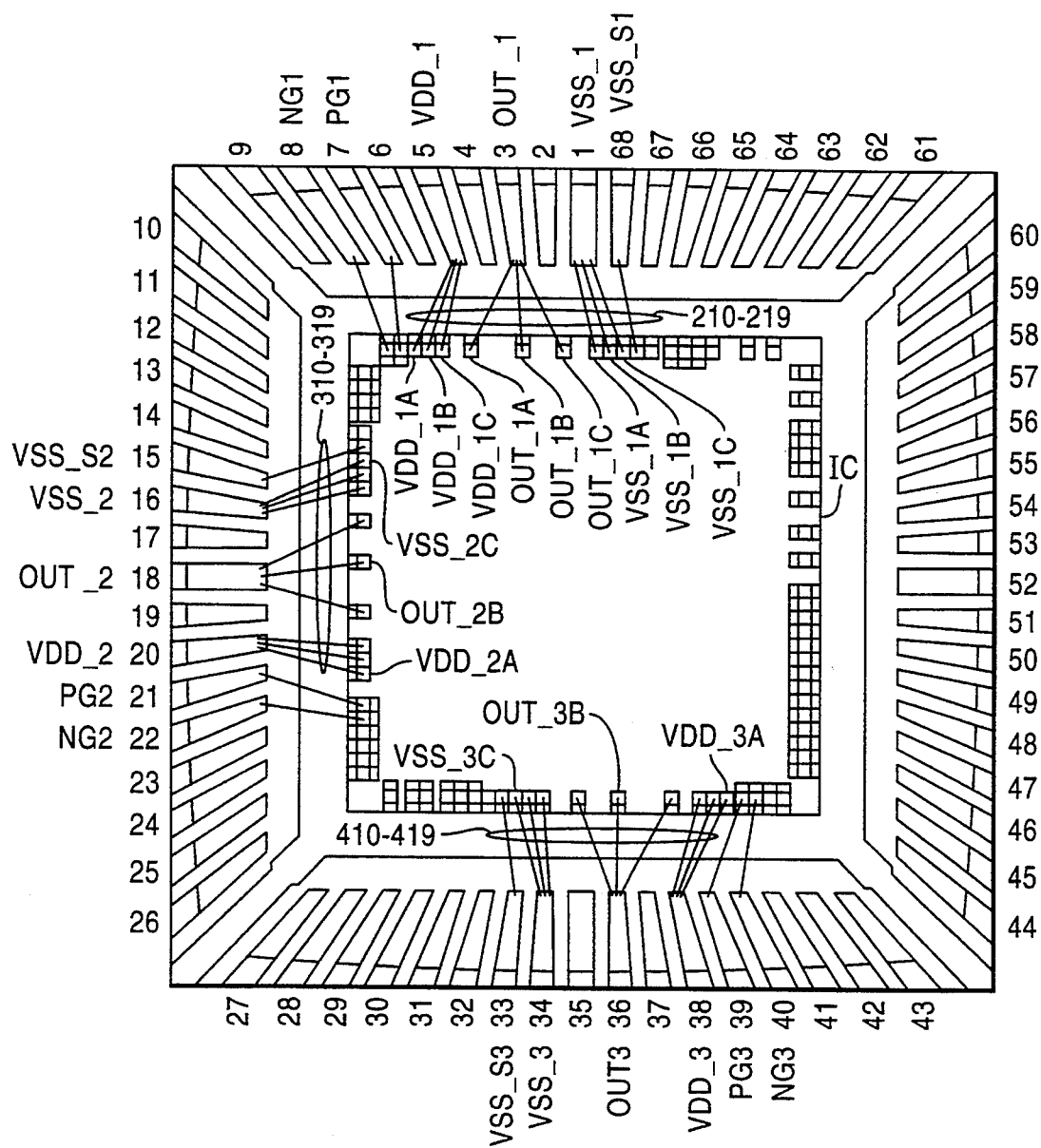
FIG. 5 illustrates the packaging for an integrated circuit chip including the three-phase motor drive electronics shown in FIGS. 2 through 4.

FIG. 5 illustrates a sixty-eight pin package for the integrated circuit chip including the three-phase motor drive electronics shown in FIGS. 2 through 4. The bonding pads of the integrated circuit, identified by reference letters IC, are connected to corresponding package pins identified by the reference numerals 1 through 68. For clarity, only bond wires associated with the drive electronics are shown, and not all package pins and bonding pads are identified. As required, each of the VDD, VSS and output bonding pads for each phase of the drive electronics are located adjacent one another.

The additional package pins, bonding wires and bonding pads not utilized for the drive electronics provide signal paths to other circuitry incorporated into integrated circuit chip IC.

It can thus be seen that there has been provided by the present invention a power FET design permitting integration of power electronics together with other analog and logic circuitry within a single CMOS integrated circuit. The design allows power output electronics and standard CMOS circuitry to be combined together within a single integrated circuit chip without alteration of the standard CMOS process.

The embodiment described above is utilized within the drive electronics for a disk drive spindle motor. The layout of the power electronics structure on the integrated circuit is novel in that, for each drive phase, three VDD voltage source busses must come together to three adjacent bonding pads, three output busses must come together to three adjacent bonding pads, and three VSS voltage source busses must come together to three adjacent bonding pads. The packaging for the integrated circuit must connect each of the three VDD bonding pads through three separate bond wires to a single package pin. The three VSS and three output bonding pads must similarly connect to single package pins.

The packaging and layout of the electronics structure on the integrated circuit may be varied from that shown in the Figures as long as the constraints listed above are observed. The structure may be incorporated within a multichip module or larger semiconductor device wherein bonding pads for the driver circuit outputs and voltage supply inputs are not required. Although FIG. 5 shows bonding pads for control inputs NG1, PG1, NG2, PG2, NG3 and PG3, the control inputs are normally generated internally from control logic within the integrated circuit chip. Thus, the IC packaging would not normally require bonding pads for the control inputs.

Although the presently preferred embodiment of the invention has been described, it will be understood that various changes may be made within the scope of the appended claims.

What is claimed is:

1. A semiconductor device comprising:
   an integrated wafer circuit including a plurality of power switch devices and a plurality of corresponding output bonding pads; each power switch device having an output terminal connected to its corresponding output bonding pad; and
   packaging for said integrated circuit wafer including an output pin for providing an electrical connection between said semiconductor device and an external device, and a plurality of bond wires corresponding to said plurality of output bonding pads, each bond wire providing an electrical connection between its corresponding bonding pad and said output pin; and wherein:
      said plurality of output bonding pads are positioned adjacent to one another along the edges of said integrated circuit wafer;
      said power switch devices operate in parallel, each contributing an essentially equivalent share of current to said output pin; and
      each one of said plurality of power switch devices comprises:
         a P-type MOSFET transistor having a source terminal, a gate terminal and a drain terminal; and
         an N-type MOSFET transistor having a source terminal, a gate terminal and a drain terminal;
         said drain terminals of said transistors being connected together to form the output terminal of said power switch device;
         the gate terminals of each one of said P-type MOSFET transistors are electrically connected together to a first control input; and
         the gate terminals of each one of said N-type MOSFET transistors are electrically connected together to a second control input.

2. The semiconductor device according to claim 1, wherein:
   said integrated circuit wafer further includes:
      a plurality of first voltage source bonding pads corresponding to said plurality of power switch devices, the source terminal of each P-type MOSFET transistor being connected to its corresponding first voltage source bonding pad; and
      a plurality of second voltage source bonding pads corresponding to said plurality of power switch devices, the source terminal of each N-type MOSFET transistor being connected to its corresponding second voltage source bonding pad; and
   said packaging for said integrated circuit wafer further includes:
      a first voltage source input pin and a second plurality of bond wires corresponding to said plurality of first voltage source bonding pads, each one of said second plurality of bonding wires providing an electrical connection between its corresponding bonding pad and said first voltage source input pin; and
      a second voltage source input pin and a third plurality of bond wires corresponding to said plurality of second voltage source bonding pads, each one of said third plurality of bonding wires providing an electrical connection between its corresponding bonding pad and said second voltage source input pin.

3. The semiconductor device according to claim 2, wherein:
   said plurality of first voltage source bonding pads are positioned adjacent to one another along the edges of said integrated circuit wafer; and
   said plurality of second voltage source bonding pads are positioned adjacent to one another along the edges of said integrated circuit wafer.

4. The semiconductor device according to claim 3, wherein said integrated circuit wafer further includes additional circuitry not associated with said power switches.

5. The semiconductor device according to claim 4, wherein said semiconductor device is implemented in CMOS technology.

6. A semiconductor device comprising an integrated circuit wafer and packaging for said integrated circuit wafer; said integrated circuit wafer including drive electronics for a multiple phase motor; wherein for each phase of said multiple phase motor:
   said integrated circuit wafer includes a plurality of power switch devices and a plurality of corresponding output bonding pads; each power switch device having an output terminal connected to its corresponding output bonding pad; and
   said packaging for said integrated circuit wafer includes an output pin for providing an electrical connection between said semiconductor device and an external device, and a plurality of bond wires corresponding to said plurality of output bonding pads, each bond wire providing an electrical connection between its corresponding bonding pad and said output pin.

7. The semiconductor device according to claim 6, wherein for each phase of said multiple phase motor:
   each one of said plurality of power switch devices comprises:
      a P-type MOSFET transistor having a source terminal, a gate terminal and a drain terminal; and
      an N-type MOSFET transistor having a source terminal, a gate terminal and a drain terminal;
      said drain terminals of said transistors being connected together to form the output terminal of said power switch device;

the gate terminals of each one of said P-type MOSFET transistors are electrically connected together to a first control input; and the gate terminals of each one of said N-type MOSFET transistors are electrically connected together to a second control input.

8. The semiconductor device according to claim 7, wherein for each phase of said multiple phase motor:

said integrated circuit wafer further includes:

a plurality of first voltage source bonding pads corresponding to said plurality of power switch devices, the source terminal of each P-type MOSFET transistor being connected to its corresponding first voltage source bonding pad; and a plurality of second voltage source bonding pads corresponding to said plurality of power switch devices, the source terminal of each N-type MOSFET transistor being connected to its corresponding second voltage source bonding pad; and said packaging for said integrated circuit wafer further includes:

a first voltage source input pin and a second plurality of bond wires corresponding to said plurality of first voltage source bonding pads, each one of said second plurality of bonding wires providing an electrical connection between its corresponding bonding pad and said first voltage source input pin; and a second voltage source input pin and a third plurality of bond wires corresponding to said plurality of second voltage source bonding pads, each one of said third plurality of bonding wires providing an electrical connection between its corresponding bonding pad and said second voltage source input pin.

9. The semiconductor device according to claim 8, wherein for each phase of said multiple phase motor:

said plurality of output bonding pads are positioned adjacent to one another along the edges of said integrated circuit wafer;

said plurality of first voltage source bonding pads are positioned adjacent to one another along the edges of said integrated circuit wafer; and said plurality of second voltage source bonding pads are positioned adjacent to one another along the edges of said integrated circuit wafer.

10. The semiconductor device according to claim 6, wherein:

each one of said plurality of power switch devices comprises:

a P-type MOSFET transistor having a source terminal, a gate terminal and a drain terminal; and an N-type MOSFET transistor having a source terminal, a gate terminal and a drain terminal;

said drain terminals of said transistors being connected together to form the output terminal of said power switch device;

the gate terminals of each one of said P-type MOSFET transistors are electrically connected together to a first control input; and the gate terminals of each one of said N-type MOSFET transistors are electrically connected together to a second control input.

11. The semiconductor device according to claim 10, wherein:

said integrated circuit wafer further includes:

a plurality of first voltage source bonding pads corresponding to said plurality of power switch devices, the source terminal of each P-type MOSFET transistor being connected to its corresponding first voltage source bonding pad; and a plurality of second voltage source bonding pads corresponding to said plurality of power switch devices, the source terminal of each N-type MOSFET transistor being connected to its corresponding second voltage source bonding pad; and said packaging for said integrated circuit wafer further includes:

a first voltage source input pin and a second plurality of bond wires corresponding to said plurality of first voltage source bonding pads, each one of said second plurality of bonding wires providing an electrical connection between its corresponding bonding pad and said first voltage source input pin; and a second voltage source input pin and a third plurality of bond wires corresponding to said plurality of second voltage source bonding pads, each one of said third plurality of bonding wires providing an electrical connection between its corresponding bonding pad and said second voltage source input pin.

* * * * *